(12) United States Patent
Bifano

(10) Patent No.: US 6,929,721 B2
(45) Date of Patent: *Aug. 16, 2005

(54) ION BEAM MODIFICATION OF RESIDUAL STRESS GRADIENTS IN THIN FILM POLYCRYSTALLINE SILICON MEMBRANES

(75) Inventor: Thomas G. Bifano, Mansfield, MA (US)

(73) Assignee: The Trustees of Boston University, Boston, MA (US)

( * ) Notice: Subject to any disclaimer, the term of this patent is extended or adjusted under 35 U.S.C. 154(b) by 207 days.

This patent is subject to a terminal disclaimer.

(21) Appl. No.: 10/175,977

(22) Filed: Jun. 20, 2002

(65) Prior Publication Data

US 2002/0155635 A1 Oct. 24, 2002

Related U.S. Application Data

(63) Continuation of application No. PCT/US00/34800, filed on Dec. 20, 2000.
(60) Provisional application No. 60/171,402, filed on Dec. 21, 1999.

(51) Int. Cl.[7] .............................................. C23C 14/32
(52) U.S. Cl. .......................... 204/192.34; 204/192.32; 204/298.36; 216/66

(58) Field of Search ....................... 204/192.32, 192.34, 204/298.36; 216/66; 428/543; 336/2

(56) References Cited

U.S. PATENT DOCUMENTS

| 4,756,796 A | | 7/1988 | Saitou ........................ 264/162 |
| 5,922,212 A | * | 7/1999 | Kano et al. ..................... 216/2 |
| 6,529,311 B1 | * | 3/2003 | Bifano et al. ............... 359/291 |

FOREIGN PATENT DOCUMENTS

| DE | 198 14 760 A1 | | 10/1999 |
| DE | 19814760 | * | 10/1999 |
| JP | 63-84114 A | | 4/1988 |
| JP | 3-103391 A | | 4/1991 |

* cited by examiner

*Primary Examiner*—Rodney G. McDonald
(74) *Attorney, Agent, or Firm*—Weingarten, Schurgin, Gagnebin & Lebovici LLP

(57) ABSTRACT

Method and apparatus for reducing the curvature of a micromachined structure having lamella (12). Surface treatment by an ion beam (30) of the lamella (12) such as by sputtering removes regions of stress allowing the lamella (12) to return to a planar condition. The resulting outer surface is made suitable for use as a reflector and other purposes needing a substantially planar surface.

28 Claims, 4 Drawing Sheets

ION BEAM MODIFICATION OF RESIDUAL STRESS GRADIENTS IN THIN FILM POLYCRYSTALLINE SILICON MEMBRANES

CROSS REFERENCE TO RELATED APPLICATIONS

This is a continuation of International Application PCT/US00/34800 with an international filing date of Dec. 20, 2000.

This application claims priority under 35 U.S.C. §119(e) to Provisional Application No. 60/171,402, filed Dec. 21, 1999; the disclosure of which is incorporated herein by reference.

ACKNOWLEDGEMENT OF GOVERNMENT SUPPORT

This invention was made with government support under Contract Number DABT63-95-C-0065 awarded by the Department of the Army. The Government has certain rights in the invention.

FIELD AND BACKGROUND OF THE INVENTION

MEMS semiconductor devices are increasingly finding applications in optical (MOEMS) and other applications where one or more surfaces are used as reflectors or for other purposes requiring a planar surface on an outer element of the finished micromachined product.

The typical micromachined structure results from many processes of diffusion, layer growth and stripping, oxidation, and metalization to name a few. These steps are often performed at different elevated temperatures. The result is the creation of a distribution of stresses throughout the MEMS device. The stresses vary from compressive to tensile stresses and produce a complex pattern of deflection forces through the semiconductor structure.

Where these devices include a lamella this is freed from the body of the semiconductor in the final stages of production, these deflection forces are free to deform the lamella into a curved shape that impairs the effectiveness of the lamella as a reflector or other element dependent on a planar outer surface.

SUMMARY OF THE INVENTION

The present invention provides a method and apparatus for reducing the curvature of a micromachined structure that has been typically released during final processing to leave a flexurally supported lamella generally thin with respect to its lateral extent. Surface treatment of the lamella such as by sputtering removes regions of stress allowing the lamella to return to a planar condition.

The surface is typically exposed to sputtering by directing a beam of ions toward it over a time sufficient to bring the surface into a substantially planar condition as determined by interferometric analysis.

BRIEF DESCRIPTION OF THE DRAWING

These and other features of the invention are more fully described in the detailed description below and the accompanying drawing of which.

DETAILED DESCRIPTION

The present invention provides method and apparatus for reducing the curvature of a micromachined structure that has been typically released during final processing to leave a flexurally supported lamella generally thin with respect to the lateral extent. Surface treatment of the lamella such as by sputtering removes regions of stress allowing the lamella to return to a planar condition.

Figure 1:
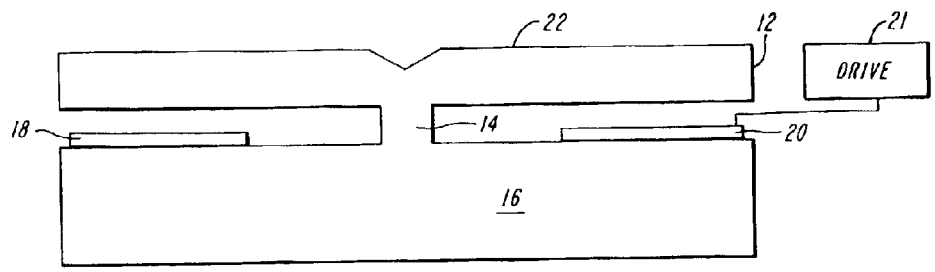
FIG. 1 is a diagrammatic view of a micromachined structure with which the invention is operative.

The processing of the material in micromachining, typically involving silicon and oxides, develops stress patterns during the processing that results in curvatures incompatible with many uses including optical reflection as in MOEMS devices. Such a device is shown in FIG. 1 diagramatically and without exaggeration of the scale to show the stress induced curvatures. As shown there, a lamella structure 12, typically a finished micromachined device formed during many steps of processing that creates stress patterns, is supported by a flexure 14 from a body 16. The structure 12 in some applications may be caused to tilt as by the application of force such as from force transducers 18 and 20 which may be capacitive. For this purpose the structure or lamella 12 is desirably planar in at least its upper surface 22, typically parallel to a bottom surface.

Figure 2:
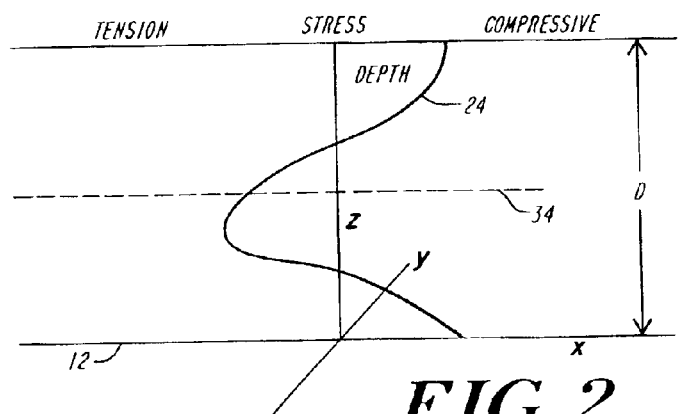
FIG. 2 is a representative stress diagram applicable to FIG. 1.
Figure 3:
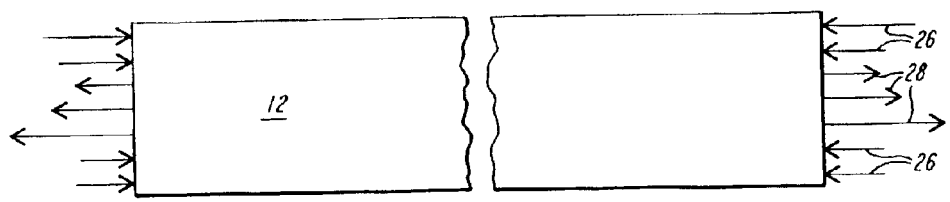
FIG. 3 illustrates vectors of compression and tension associated a micromachined structure of FIG. 1.

The lamella structure 12 will typically be a result of diffusions, oxidations, erosions and metalizations among other steps that imparts compressive and tension forces. FIG. 2 illustrates an exemplary distribution curve 24 of the stresses over the thickness "D" in the "Z" axis. FIG. 3 shows a similar distribution in the form of compression vectors 26 and tensile vectors 28. The illustrated distribution includes a distance weighted distribution that is net compressive above a central neutral plane 34.

Figure 4:
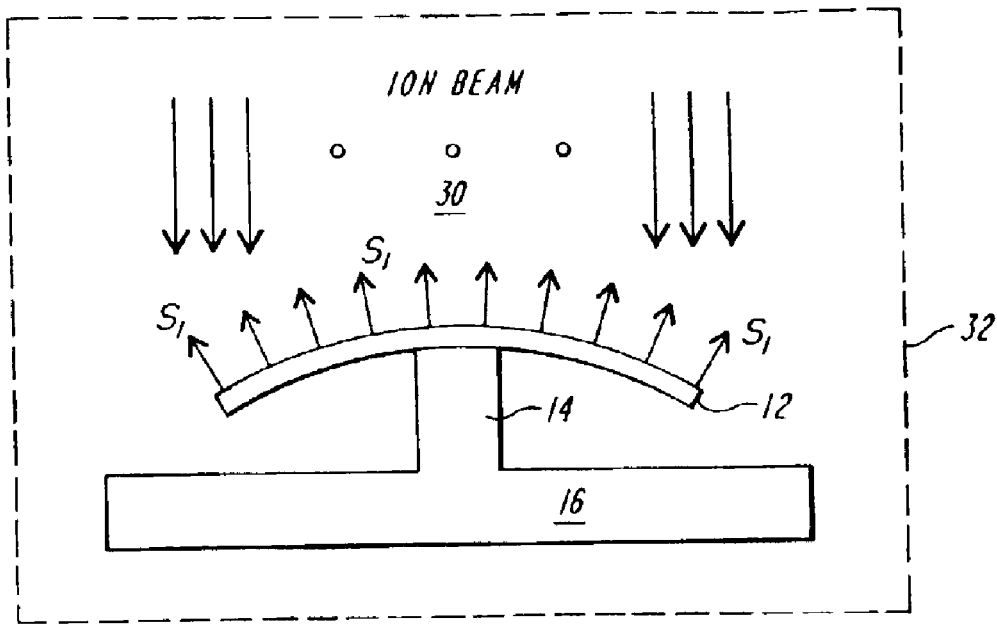
FIG. 4 illustrates apparatus for changing the stress induced curvature of a structure as shown in FIG. 1.

The resulting stresses create a curvature of the lamella structure 12 as shown in FIG. 4 which is substantially free to deflect being held only by the limited central flexure 14 support. At that point the compressive and tensile forces, or their Z axis weighted integrals over the depth D in both the "X" and "Y" directions are balanced.

The curvature shown in lamella 12 is reduced by the application of surface treatment. In the case where the upper surface 22 is in compression and the curvature is convex, surface material is removed as by the application of an ion beam 30. The beam 30 is for example an argon beam generated within a vacuum or other chamber 32. The beam may be uniform or have a gradient, scanned or steady as the application requires. As the material is removed by sputtering caused by the ion beam 30, the moments of bending created by the compression are reduced. Since these are at the Z axis extremes on the lamella the effect on the bending moment is great. At the same time the neutral center 34 (FIG. 2) moves downward adjusting the distribution pattern which may further reduce the curvature.

In the case of other forms of stress distribution in the lamella 12, the other forms of stress layer removal or redistribution can be used.

Figure 5:
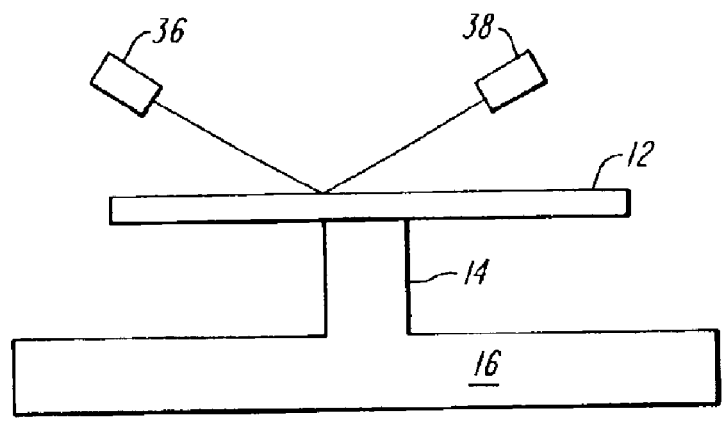
FIG. 5 illustrates apparatus for testing curvature of a structure of FIG. 1.
Figure 6:
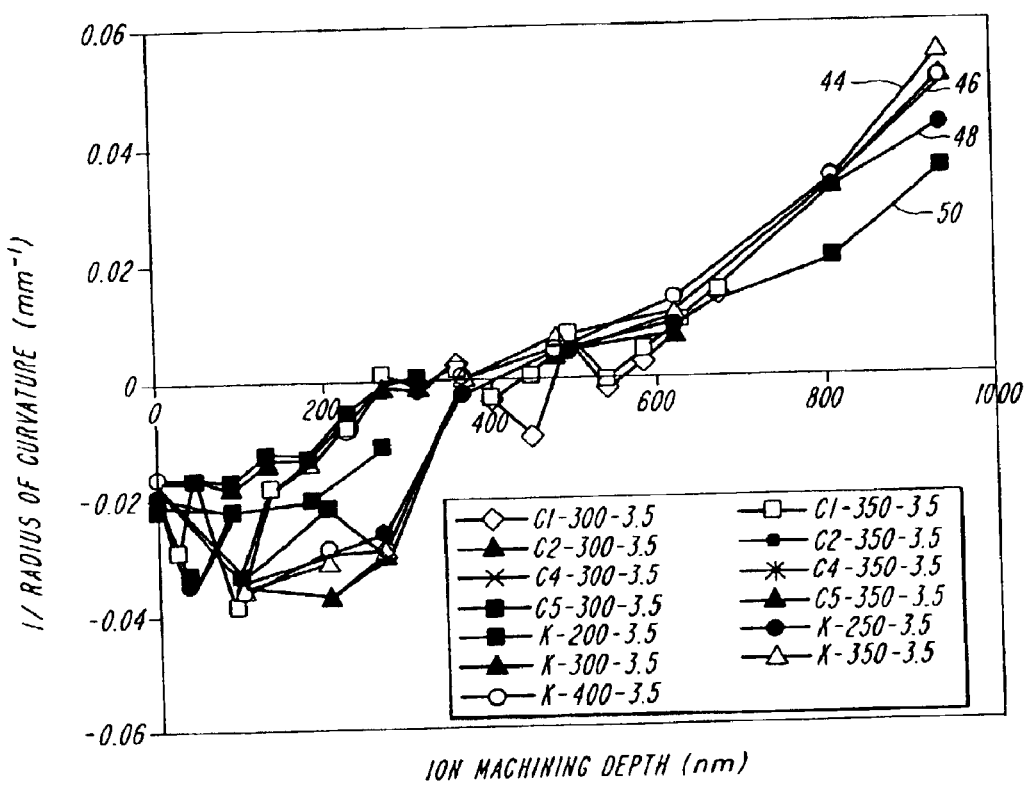
FIG. 6 illustrates the results of exemplary curvature reduction according to the invention.
Figure 7A:
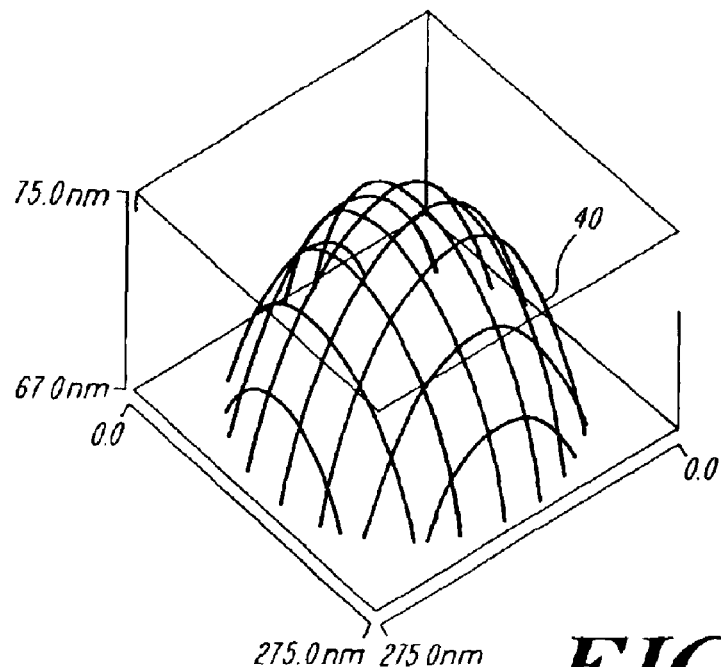
FIGS. 7a and 7b illustrate before and after curvature reduction interferometrically determined.
Figure 7B:
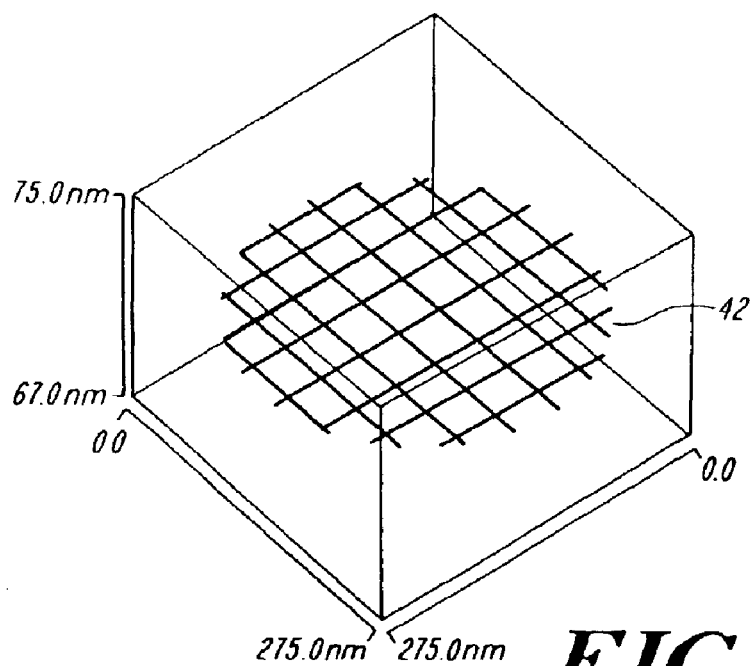

The degree of straightening of the lamella 12 is detected by an interferometric apparatus as shown in FIG. 5. There a source of a coherent beam or beams from a laser 36 is applied to the surface 22 of the lamella. An interferometric microscope 38 detects the interference pattern that indicates the degree to which the lamella has been flattened or made planar. FIG. 7a shows an interferogram surface 40 representative of the surface 22 prior to curvature reduction while FIG. 7b shows the surface interferogram near or at the end of the flattening procedure. FIG. 6 shows a set of curves 44-50 representing the change in curvature as represented by the radius of curvature. The exemplary dimensions of 3.5 micron lamella thickness and surface removal in the range of 300 to 450 nonameters to straighten indicates a predictability to the surface flattening The reduction in curvature and resulting increase in radius of curvature from an exemplary 60 nm to 1400 nm was accompanied by a reduction in peak to valley sags of 160 nm to 18 nm.

What is cclaimed is:

1. A process for reducing curvature in isolated micromachined elements comprising the steps of:
    providing a micromachined structure having an upper surface and a substantially matching lower surface with said upper surface having a curvature positioning it out of plane and created by processing stresses distributed non uniformly throughout a depth of said structure;
    applying surface modifying energy to said structure to remove an entire surface layer from said structure to alter the distribution of the stresses throughout said structure to reduce the out of plane curvature.

2. The process of claim 1 wherein said structure is supported to provide freedom of movement of at least a portion of said structure.

3. The process of claim 2 wherein said structure is flexibly supported.

4. The process of claim 2 wherein said structure includes an actuable motive force generator whereby in response to actuation, said structure is forced to undergo movement thereby.

5. The process of claim 1 wherein said structure is supported to expose said upper surface and the curvature of said upper surface is nonplanar.

6. The process of claim 5 wherein said surface modifying energy is an ion beam.

7. The process of claim 6 wherein said ion beam is uniform.

8. The process of claim 6 wherein said beam is an Argon ion beam.

9. The process of claim 1 wherein said surface modifying energy is an ion beam.

10. The process of claim 9 wherein said ion beam is uniform.

11. The process of claim 9 wherein said beam is an Argon ion beam.

12. The process of claim 1 wherein said surface modification reduces said curvature to substantial insignificance for use of said upper surface as a reflector.

13. The process of claim 1 wherein said distribution of stresses nets to compressive on a distance weighted basis above a neutral central surface between said upper and lower surfaces.

14. The process of claim 1 wherein said distribution of stresses is substantially compressive near said upper surface.

15. Apparatus for reducing curvature in isolated micromachined elements comprising:
    a housing for a micromachined structure having an upper surface and a substantially matching lower surface with said upper surface having a curvature positioning it out of plane and created by processing stresses distributed non uniformly throughout a depth of said structure;
    a source of a surface modifying energy for application to said structure to remove an entire surface layer from said structure to alter the distribution of the stresses throughout said structure to reduce the out of plane curvature.

16. The apparatus of claim 15 wherein said structure is supported to provide freedom of movement of at least a portion of said structure.

17. The apparatus of claim 16 wherein said structure is flexibly supported.

18. The apparatus of claim 16 wherein said structure includes an actuable motive force generator whereby in response to actuation, said structure is forced to undergo movement thereby.

19. The apparatus of claim 15 wherein said structure is supported to expose said upper surface and the curvature of said upper surface is nonplanar.

20. The apparatus 19 wherein said surface modifying energy is an ion beam.

21. The apparatus of claim 20 wherein said ion beam is uniform.

22. The apparatus of claim 20 wherein said beam is an Argon ion beam.

23. The apparatus of claim 15 wherein said surface modifying energy is an ion beam.

24. The apparatus of claim 23 wherein said ion beam is uniform.

25. The apparatus of claim 23 wherein said beam is an Argon ion beam.

26. The apparatus of claim 15 wherein said surface modification reduces said curvature to substantial insignificance for use of said upper surface as a reflector.

27. The apparatus of claim 15 wherein said distribution of stresses nets to compressive on a distance weighted basis above a neutral central surface between said upper and lower surfaces.

28. The apparatus of claim 15 wherein said distribution of stresses is substantially compressive near said upper surface.

* * * * *

UNITED STATES PATENT AND TRADEMARK OFFICE
CERTIFICATE OF CORRECTION

| | |
|---|---|
| PATENT NO. | : 6,929,721 B2 |
| APPLICATION NO. | : 10/175977 |
| DATED | : August 16, 2005 |
| INVENTOR(S) | : Thomas G. Bifano |

It is certified that error appears in the above-identified patent and that said Letters Patent is hereby corrected as shown below:

Column 2, line 2, "a" should read --with the--;

Column 3, line 19, "cclaimed" should read --claimed--;

Column 4, line 34, "apparatus 19" should read --apparatus of claim 19--; and

Column 4, line 40, "apparatus 15" should read --apparatus of claim 15--.

Signed and Sealed this

Twenty-second Day of August, 2006

JON W. DUDAS
*Director of the United States Patent and Trademark Office*